(12) United States Patent
Daneman et al.

(10) Patent No.: US 6,528,887 B2
(45) Date of Patent: Mar. 4, 2003

(54) CONDUCTIVE EQUIPOTENTIAL LANDING PADS FORMED ON THE UNDERSIDE OF A MEMS DEVICE

(75) Inventors: Michael J. Daneman, Pacifica, CA (US); Behrang Behin, Berkeley, CA (US)

(73) Assignee: Onix Microsystems, Richmond, CA (US)

( * ) Notice: Subject to any disclaimer, the term of this patent is extended or adjusted under 35 U.S.C. 154(b) by 0 days.

(21) Appl. No.: 09/798,129

(22) Filed: Mar. 1, 2001

(65) Prior Publication Data

US 2002/0079550 A1 Jun. 27, 2002

Related U.S. Application Data

(63) Continuation-in-part of application No. 09/546,432, filed on Apr. 10, 2000, and a continuation-in-part of application No. 09/511,428, filed on Feb. 23, 2001.

(51) Int. Cl.[7] .......................... H01L 23/52; H01L 23/12
(52) U.S. Cl. ................. 257/774; 257/773; 257/731; 257/734
(58) Field of Search .................. 257/774, 750, 257/758, 773, 731, 734, 444, 739, 786; 438/629, 637, 652, 118, 622, 618, 666, 48

(56) References Cited

U.S. PATENT DOCUMENTS

| 5,043,043 | A |   | 8/1991 | Howe et al. ............. 156/654 |
|---|---|---|---|---|
| 5,206,983 | A |   | 5/1993 | Guckel et al. ........... 29/598 |
| 5,327,033 | A |   | 7/1994 | Guckel et al. ........... 310/40 |
| 5,629,918 | A | * | 5/1997 | Ho et al. ................ 369/112 |
| 5,637,539 | A |   | 6/1997 | Hofmann et al. ......... 438/20 |
| 5,638,946 | A |   | 6/1997 | Zavracky ............... 200/181 |
| 5,644,177 | A |   | 7/1997 | Guckel et al. ........... 310/40 |
| 5,645,684 | A |   | 7/1997 | Keller ................. 156/643.1 |
| 5,646,464 | A |   | 7/1997 | Sickafus ............... 310/40 |
| 5,662,771 | A |   | 9/1997 | Stoupe ................. 438/52 |

(List continued on next page.)

FOREIGN PATENT DOCUMENTS

| JP | 11145585 | 5/1999 | ......... H01L/29/84 |
|---|---|---|---|
| JP | 200049357 | 2/2000 | ......... H01L/29/84 |
| WO | WO9321536 | 10/1993 | ......... G01P/15/08 |
| WO | WO9835258 | 8/1998 | ......... G02B/26/08 |
| WO | WO9936941 A3 | 7/1999 | ......... H01L/22/00 |
| WO | WO9936941 A2 | 7/1999 | |

OTHER PUBLICATIONS

Storment, C., *Flexible, Dry–Released Process for Aluminum Electrostatic Actuators*, Sep. 1994, pp. 90–96.

Behrang Behin et al, Magnetically Actuated Micromirrors for Fiber–Optic Switching, Jun., 98. Solid–State Sensor and Actuator Workshop Hilton Head Island, South Carolina.pp 273–276.

Behrang Behin et al, Cantilevered Microstructure Methods and Apparatus, Feb. 23, 2000, p. 1–28. Application No.: 09/511,428.

*Primary Examiner*—Jasmine J B Clark

(57) ABSTRACT

A MEMS device with a flap having one or more conductive landing areas electrically isolated from the flap and electrically coupled to a landing surface to reduce stiction. The device may be formed from a device layer of a silicon-on-insulator (SOI) substrate with conductive landing pads fabricated by forming one or more vias through the device layer, an underlying sacrificial layer etched to form one or more depressions at locations corresponding the vias and filled with a conductive landing pad material to form a structure having one or more electrically isolated landing pad areas on an underside of the device layer. A method for operating a MEMs device in an equipotential stiction reduction mode is also provided.

25 Claims, 15 Drawing Sheets

U.S. PATENT DOCUMENTS

| | | |
|---|---|---|
| 5,717,631 A | 2/1998 | Carley et al. ............... 365/174 |
| 5,774,604 A | 6/1998 | McDonald .................. 385/18 |
| 5,839,722 A | 11/1998 | Berlin et al. ........... 271/265.02 |
| 5,842,106 A | 11/1998 | Thaler et al. .................. 419/8 |
| 5,866,281 A | 2/1999 | Guckel et al. ................ 430/22 |
| 5,867,202 A | 2/1999 | Knipe et al. ................ 347/239 |
| 5,881,598 A | 3/1999 | Sapuppo et al. .............. 74/5.6 |
| 5,908,719 A | 6/1999 | Guckel et al. ................. 430/5 |
| 5,914,507 A | 6/1999 | Polla et al. ................. 257/254 |
| 5,929,542 A | 7/1999 | Ohnstein et al. ............. 310/40 |
| 5,943,155 A | 8/1999 | Goossen et al. ........... 359/247 |
| 5,949,571 A | 9/1999 | Goossen et al. ........... 359/291 |
| 5,959,338 A | 9/1999 | Younger et al. ............ 257/419 |
| 5,963,788 A | 10/1999 | Barron et al. ................. 438/48 |
| 5,971,355 A | 10/1999 | Biegelsen et al. ..... 251/129.06 |
| 6,028,331 A | 2/2000 | Mastromatteo et al. ..... 257/253 |
| 6,078,100 A | 6/2000 | Duesman et al. .......... 257/690 |
| 6,087,747 A | 7/2000 | Dhuler ........................ 310/90 |
| 6,265,781 B1 | 7/2001 | Andreas .................... 257/765 |
| 6,303,986 B1 * | 10/2001 | Shook ........................ 257/680 |
| 6,188,301 B1 * | 2/2002 | Kornrumpf et al. ........ 333/262 |
| 6,396,975 B1 | 5/2002 | Wood et al. .................. 385/18 |

* cited by examiner

CONDUCTIVE EQUIPOTENTIAL LANDING PADS FORMED ON THE UNDERSIDE OF A MEMS DEVICE

CROSS REFERENCE TO RELATED APPLICATION

This application is a continuation in part of U.S. patent application Ser. No. 09/546,432, filed Apr. 10, 2000, and entitled "Mechanical Landing Pad Formed on the Underside of a MEMS Device," which is incorporated herein by reference. This application is also a continuation-in-part of U.S. patent application Ser. No. 09/511,428 to Behrang Behin, Kam Lau and Richard Muller, filed Feb. 23, 2001 and titled "Cantilevered Microstructure Methods and Apparatus."

FIELD OF THE INVENTION

This invention relates generally microelectromechanical systems (MEMS). More particularly, forming conductive landing pads on MEMS structures.

BACKGROUND ART

Microelectromechanical systems (MEMS) are miniature mechanical devices manufactured using the techniques developed by the semiconductor industry for integrated circuit fabrication. Such techniques generally involve depositing layers of material that form the device, selectively etching features in the layer to shape the device and removing certain layers (known as sacrificial layers, to release the device. Such techniques have been used, for example, to fabricate miniature electric motors as described in U.S. Pat. No. 5,043,043.

Recently, MEMS devices have been developed for optical switching. Such systems typically include an array of mechanically actuatable mirrors that deflect light from one optical fiber to another. The mirrors are configured to translate and move into the path of the light from the fiber. Mirrors that move into the light path generally use torsion flexures to translate mirror position vertically while changing its angular position from a horizontal to a vertical orientation. MEMS mirrors of this type are usually actuated by magnetic interaction, electrostatic interaction, thermal actuation or some combination of these. The design, fabrication, and operation of magnetically actuated micromirrors with electrostatic clamping in dual positions for fiber-optic switching applications are described, e.g., by B. Behin, K. Lau, R. Muller in "Magnetically Actuated Micromirrors for Fiber-Optic Switching," Solid-State and Actuator Workshop, Hilton Head Island, S.C., Jun. 8–11, 1998 (p. 273–276).

When the mirror is in the horizontal position, it rests against a substrate that forms a base. Often, the mirror is subject to electromechanical forces, sometimes referred to as "stiction" that cause the mirror to stick to the substrate and prevent the mirror from moving. The same stiction forces can also prevent the mirror from being properly released from the substrate during manufacture. To overcome stiction problems, landing pads (also called dimples or bumps have been used extensively in MEMS devices to minimize or otherwise control the contact area between the device and the underlying substrate. In the prior art, such landing pads are formed prior to deposition of a device layer either by etching pits in an underlying sacrificial layer or by depositing pads of another material prior to the deposition of the layer forming the device.

Recently, silicon on insulator (SOI) techniques have been developed for fabricating MEMS devices. In SOI, an oxide layer is grown or deposited on a silicon wafer. A second silicon wafer is then bonded to the oxide layer, e.g. by plasma bonding. After bonding, the second silicon wafer is cleaved such that a thin layer of silicon is left attached to the oxide layer to form an SOI substrate. However, when that thin silicon layer is a MEMS device layer it is generally not possible to process the underside of the device layer prior to bonding the device layer to the oxide layer. Any processing of the device layer must therefore be done after it is attached to the underlying substrate. However since the underside of the device layer is firmly attached to the oxide layer it is not normally possible to deposit material on or etch material from the underside of the device layer. Currently, no technology exists for forming pads on the underside of the device layer of a MEMS device fabricated using SOI.

There is a need, therefore, for an SOI MEMS device having landing pads on an underside of the device layer and a method of fabricating same.

The problem of stiction with respect to an exemplary MEMs mirror device 800 is shown in FIG. 8. The device 800 includes a mirror 811 formed from the device layer 812 of a substrate 810. The mirror 811 may be movably attached to the device layer by a flexure 814, actuated by an. off-chip electromagnet, and individually addressed by electrostatic clamping either to a surface of the substrate 810 or to a vertical sidewall 804 of a top mounted chip 806. Magnetic actuation may move the mirror 811 between a rest position parallel to the substrate 810 and a position nearly parallel to the vertical sidewall 804 of the top-mounted chip 806, while the application of electrostatic field may clamp the mirror 811 in the horizontal or vertical position. The electrostatic field used to hold the mirror 811 in a position regardless of whether the magnetic field is on or off can increase the level of stiction between the mirror 811 and each landing surface.

When clamped to either the substrate 810 or the vertical sidewall surface 804, the mirror rests on a set of landing pads or dimples 822, 824, which may protrude below or above the mirror surface, respectively. These landing pads 822, 824 minimize the physical area of contact between the mirror 811 and the clamping surface, thus reducing stiction effects. However, since the mirror 811 and clamping surface (either the side wall 804 or the substrate 802) are at different potentials, the landing pads 822, 824 are made of an insulating material in order to prevent an electrical short between the mirror 811 and the clamping surface. While the insulating landing pad material does, indeed, prevent an electrical short, its inherent properties can lead to other problems. Firstly, most insulating materials have the capacity to trap electrical charge and can, in some cases, maintain that charge for long periods of time—sometimes indefinitely. As a result, the potential of the landing pads 822, 824 can drift to an arbitrary value, resulting in either parasitic clamping potential between the mirror 811 and the clamping surface, even when both are externally driven to the same voltage, or a reduced clamping force by shielding the mirror potential. Second, since the insulating landing pads 822, 824 will typically be at a potential close to the mirror potential when not in contact with the clamping surface, a rapid discharge can occur when the landing pads 822, 824 first come into the contact with the clamping surface that is a kept at a potential different than the mirror 811. This rapid discharge may be exhibited as arcing or short pulses of high current. Such surges can lead to physical damage to the landing pads 822, 824 or the clamping surface, or may produce micro-welding, where the landing pad is welded to the clamping surface—resulting in the mirror 811 being stuck.

There is a need, therefore, for a MEMS device having stiction resistant landing pads and a method of operating a MEMS device configured in a stiction reduced mode.

SUMMARY

The disadvantages associated with the prior art are overcome by a MEMs design having electrically isolated conductive landing pad structures that can be set to the same electrical potential as the landing surface. The design is enabled by providing a substrate having a sacrificial layer disposed between a base layer and a device layer. One or more vias are etched through the device layer and the sacrificial layer is etched forming depressions in the sacrificial layer at locations corresponding to vias in the device layer. The vias and depressions are filled with an electrically conductive landing pad material forming an isolated structure having landing pads that may be coupled to a voltage potential substantially equal to that of the landing surface.

The various embodiments of the present invention include methods of production and inventive devices having a device layer with at least one landing pad on an underside of the device layer attached to the device layer by a plug passing through an opening in the device layer. The device may be attached to the device layer by one or more compliant flexures, which allow the device to move in and out of a plane defined by the device layer.

The various embodiments are well suited to use with silicon on insulator substrates since the patterning of a sacrificial oxide layer may be performed either before or after bonding the device layer to the rest of the substrate, however other materials may be substituted by one skilled in the art.

Particular embodiments of this design may be applied to photonic switching applications using MEMs mirrors and other light path altering mediums.

The present invention includes one method of fabricating a mirror structure having landing pads made of a conductive material that are electrically insulated from the mirror and are kept at a potential equal to that of the landing surface. The landing pads may alternatively be located on the clamping surface, being electrically isolated from therefrom and kept at a potential equal to that of the mirror structure.

Alternative embodiments provide for a MEMS device having conductive landing pads on an underside of a flap, wherein the landing pads are electrically isolated from the flap and wherein the one or more landing pads are electrically coupled to a landing surface, e.g. a base or a sidewall. The device may optionally include conductive landing pads disposed on a top surface of the flap that are electrically isolated from the flap and electrically coupled to the sidewall. The device may also optionally include conductive landing pads on the base that are electrically isolated from the base and electrically coupled to the flap. Alternatively, the device may optionally include conductive landing pads disposed on the sidewall that are electrically isolated from the sidewall and electrically coupled to the flap.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1A:
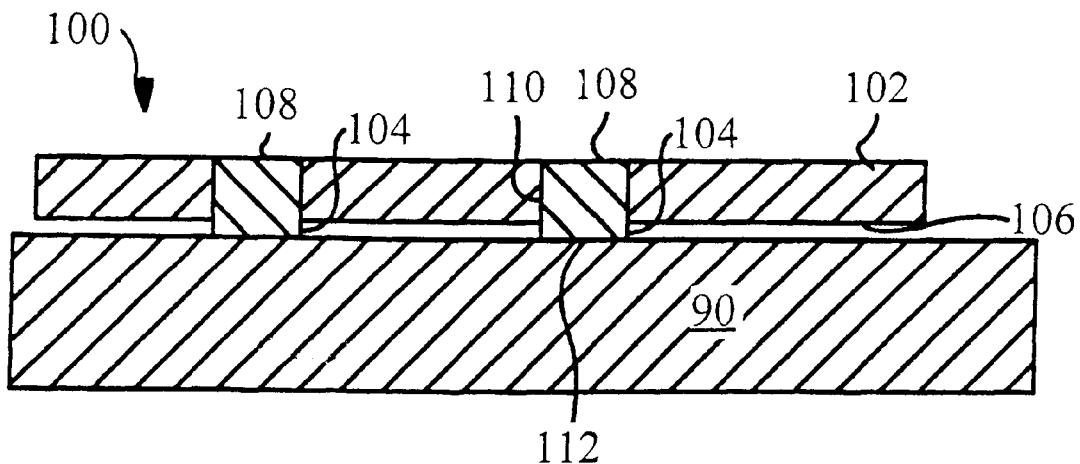
FIG. 1A depicts a landing pad structure according to a first embodiment of the present invention.
Figure 1B:
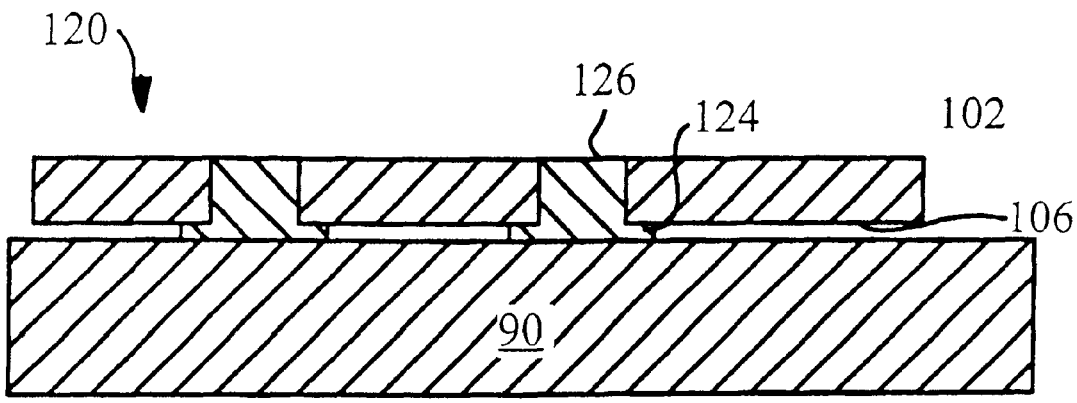
FIG. 1B depicts a landing pad structure according to a second embodiment of the present invention.
Figure 1C:
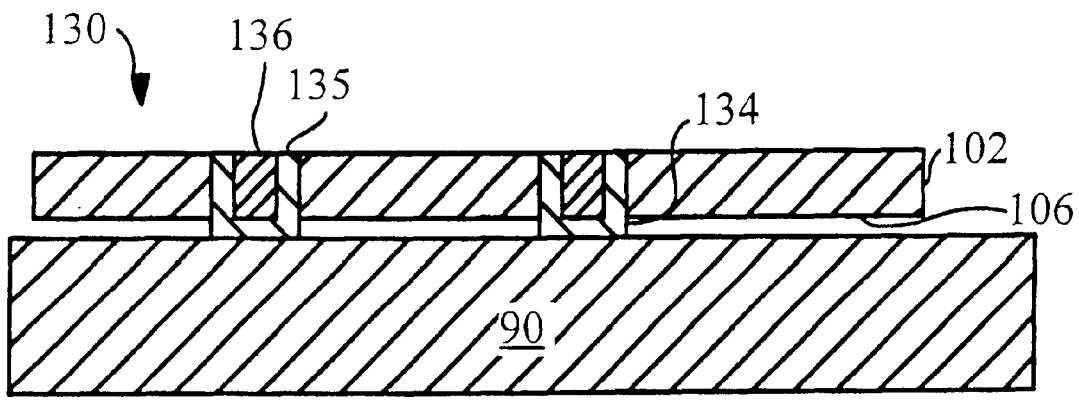
FIG. 1C depicts a multilayer landing pad structure according to a third embodiment of the present invention.

Variations on a device with the inventive landing pad structure are depicted in FIGS. 1A–1C. In a first embodiment of the invention, depicted in FIG. 1A, a basic device 100 includes a device layer 102 and at least one landing pad 104 protruding from an underside 106 of device layer 102. Landing pad 104 is attached to device layer 102 by a plug 108 passing through an opening 110 in device layer 102. The landing pad provides a smaller contact area 112 than an area of underside 106. The smaller contact area serves to reduce stiction between device 100 and an underlying substrate 90. Stiction may also be reduced by proper choice of the material comprising landing pad 104.

Device 100 may be any type of electromechanical device. Suitable devices include side-actuated motors, and electromagnetically or thermally actuatable mirrors for optical switches. Device layer 102 is typically a semiconductor material such as silicon, although other possible materials including metals and dielectrics may also be used.

Depending on the specific application, landing pad 104 may be made from a dielectric material, such as silicon nitride, or a metal, such as Tungsten, titanium nitride or the like. Alternatively the landing pad may be made from polycrystalline silicon or other similar material.

Two variations on the basic device 100 are depicted in FIGS. 1B and 1C. FIG. 1B depicts a second embodiment of the invention. The basic structure of the device in this embodiment shares features in common with device 100 of FIG. 1A. In the second embodiment, a device 120 includes at least one landing pad 124 having a diameter greater than a plug 126. This type of device can be fabricated using wet processing, which is a lower cost process than dry processing. FIG. 1C depicts a third embodiment, in which a device 130 includes at least one landing pad 134 comprised of two or more separate layers 135 and 136. Generally, layers 135 and 136 are made from different materials. For example, layer 135, which contacts substrate. 112, may be a dielectric layer. For example, layer 136, may be a conductive material, which is part of an electrode structure. Layer 135 insulates layer 136 from electrical contact with substrate 112.

Figure 2A:
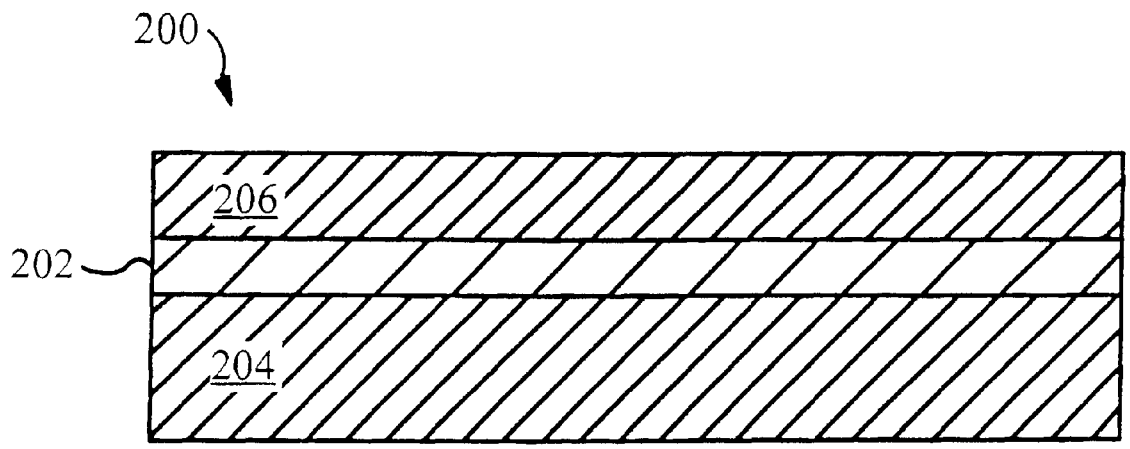
FIGS. 2A–2E depict fabrication of a device according to a fourth embodiment of the present invention.

The devices depicted in FIGS. 1A–1C may be fabricated by an inventive method according to a fourth embodiment of the invention. The basic steps of the method are depicted in FIGS. 2A–2E. FIG. 2A depicts the basic substrate 200 from which the device is made. Substrate 200 generally includes a sacrificial layer 202 disposed between a base layer 204 and a device layer 206. The substrate may be formed by a silicon on insulator (SOI) fabrication process. When an SOI substrate is used, sacrificial layer 202 is typically an oxide. formed by oxidizing a silicon base layer 204. Such a structure is sometimes referred to as silicon on oxide (SOI). Alternatively, sacrificial layer 202 may be a nitride layer, in which case the structure is sometimes referred to as silicon on nitride. Other possible configurations for substrate 200 include silicon on polymer, glass on silicon, glass on nitride and other multiple-layer substrates.

Figure 2B:
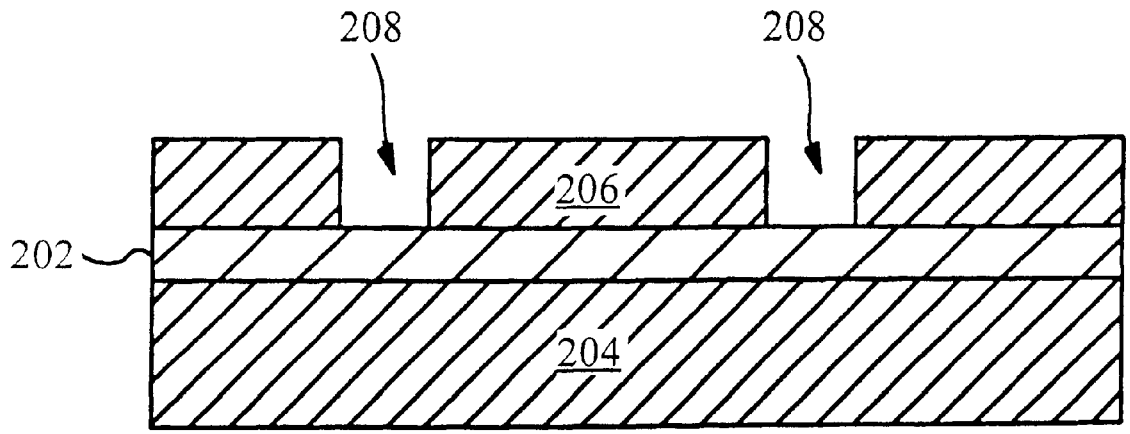

Next one or more vias 208 are formed through device layer 206 all the way to sacrificial layer 202 as shown in FIG. 2B. Vias 208 may be formed in device layer 206 by dry etch processes, such as reactive ion etching (RIE) or wet etch processes, e.g., anisotropic etching of Si with KOH. In such etch processes, sacrificial layer 202 often resists attack by etchants used to form vias 208 and therefore acts as an etch stop. Alternatively, vias 208 may be laser drilled or formed by local oxidation (LOCOS) and oxide etch.

Figure 2C:
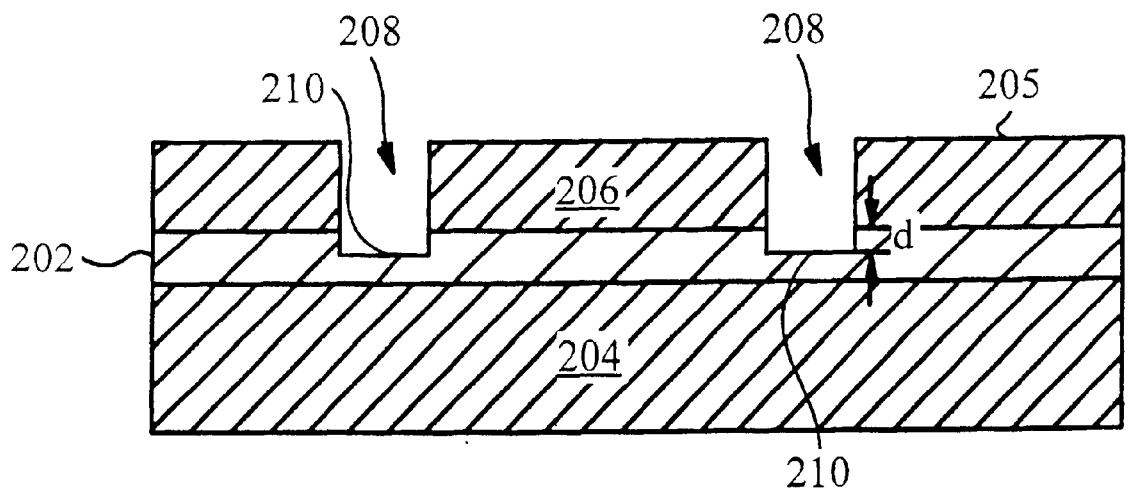

After vias 208 have been formed in device layer 206 sacrificial layer 202 is partially etched as shown in FIG. 2C. The etching of sacrificial layer 202 forms one or more depressions 210 having a depth d at locations corresponding to locations of vias in the device layer. A different etch process than that used to form vias 208 may be used to form depressions 210. By whatever process they are formed, depressions 210 do not penetrate all the way through to base layer 204. In other words the depth d of the depressions is less than the thickness t of sacrificial layer 202.

Figure 2D:
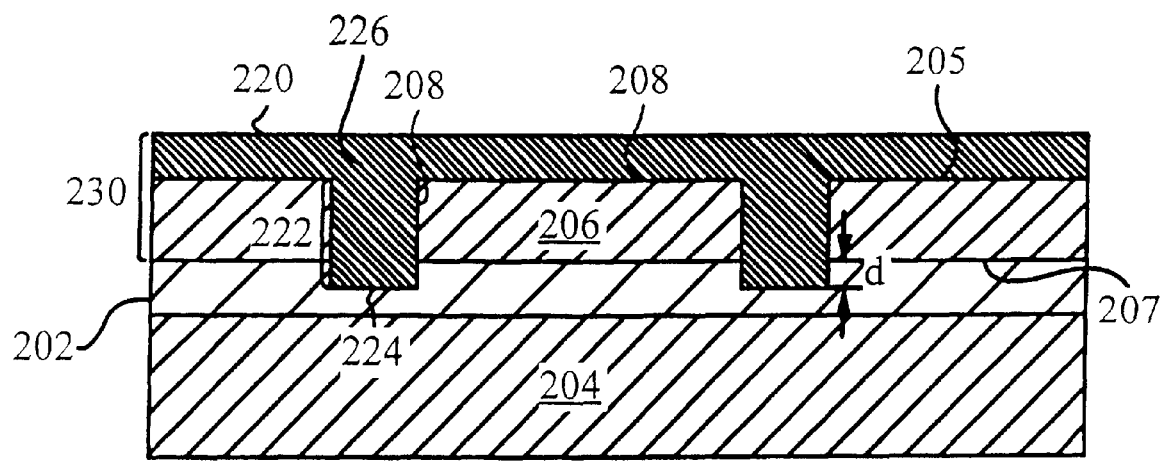

After forming depressions 210, vias 208 and depressions 210 are filled with a layer landing pad material 220 as shown in FIG. 2D. Layer 220 may optionally be planarized down to a top surface 205 of device layer 206, e.g. by chemical mechanical polishing (CMP). Filling depressions 210 and vias 208 forms a structure 222 having one or more landing pads 224 protruding from an underside 207 of device layer 206. Each landing pad 224 is connected to structure 220 by a plug 226 of material that fills via 208. The depth d of depressions 210 determines the thickness of landing pads 224. If depressions 210 are formed such that they undercut device layer 206, e.g., by isotropic etching. Landing pad 224 can have a larger diameter than a diameter of plug 226 resulting in a landing pad structure similar to that shown in FIG. 1B. The landing pad structure shown in FIG. 1C may be fabricated by partially etching plugs 226 and filling the resulting void with a layer of material. In a particular embodiment landing pad material 220 is deposited inside vias 208 to a thickness of at least one-half the diameter of a widest via 208 to ensure that the landing pad material 220 plugs the vias.

Figure 2E:
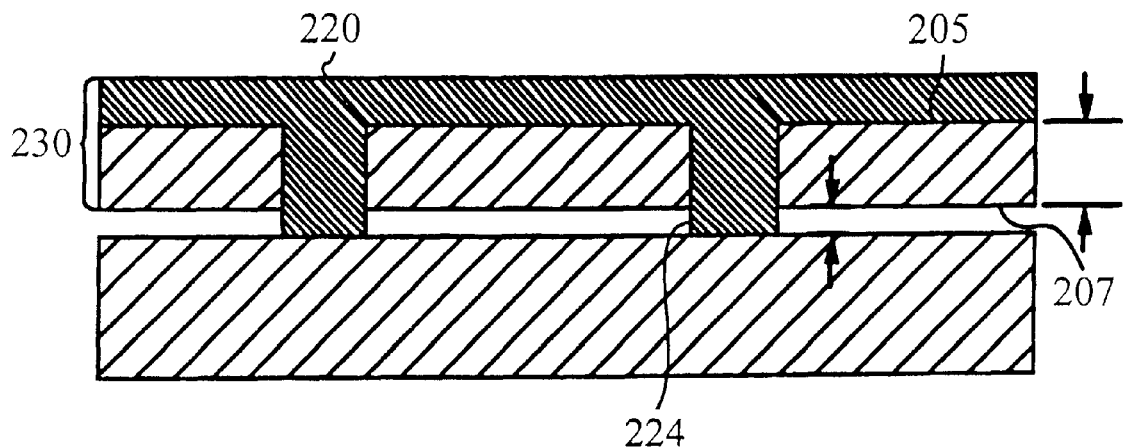

Pad material layer 220 and device layer 206 generally comprise a device 230. After landing pad material 226 has been deposited, sacrificial layer 202 is removed to release device 230 as shown in FIG. 2E. Sacrificial layer 202 may be removed by any suitable method, such as wet etch or other isotropic etch process.

Figure 3A:
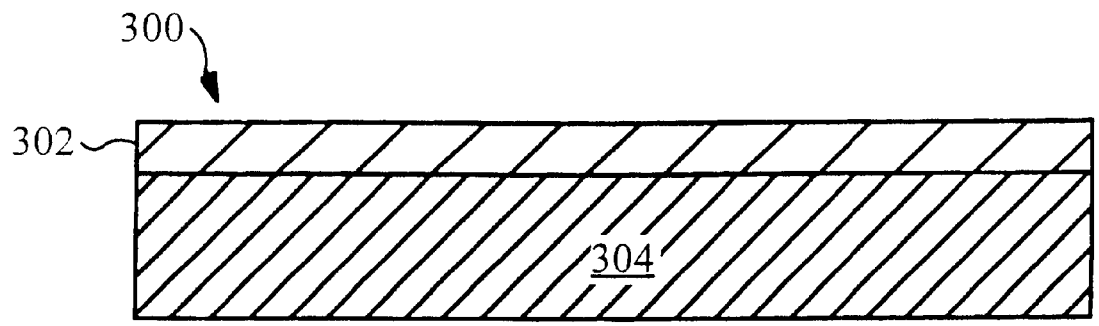
FIGS. 3A–3E depict fabrication of a device according to a fifth embodiment of the present invention.

Devices of the type shown in FIGS. 1A–1C may alternatively be fabricated by a method according to a fifth embodiment of the invention. The basic steps of the method are depicted in FIGS. 3A–3E. FIG. 3A depicts a basic substrate 300 from which the device is made. Substrate 300 generally includes a sacrificial layer 302 disposed on top of a base layer 304. Substrate 300 may be formed by a silicon-on-insulator (SOI) fabrication process, e.g. by oxidizing a silicon base layer 304. Alternatively, an oxide or nitride layer may be deposited on top of base layer 304. Other possible configurations for substrate 300 include silicon on polymer, glass on silicon, glass on nitride and the like.

Figure 3B:
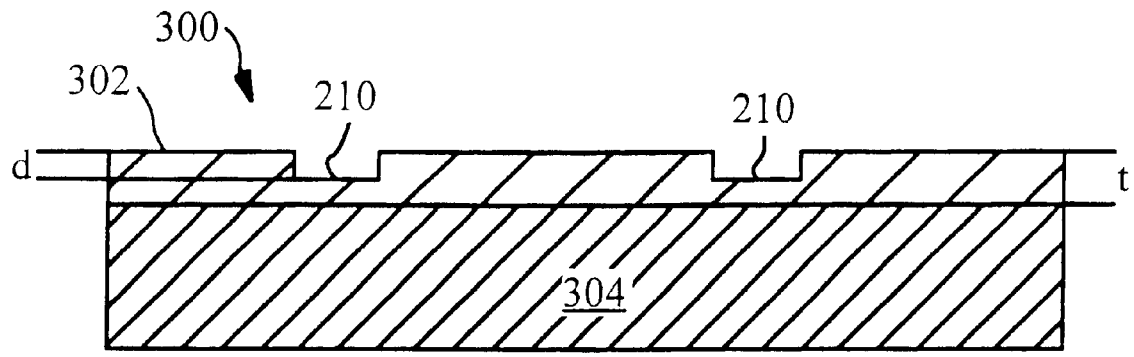

Next sacrificial layer 302 is partially etched to form one or more depressions 310 as shown in FIG. 3B. Depressions 310 having a depth d that is less than the thickness t of sacrificial layer 302.

Figure 3C:
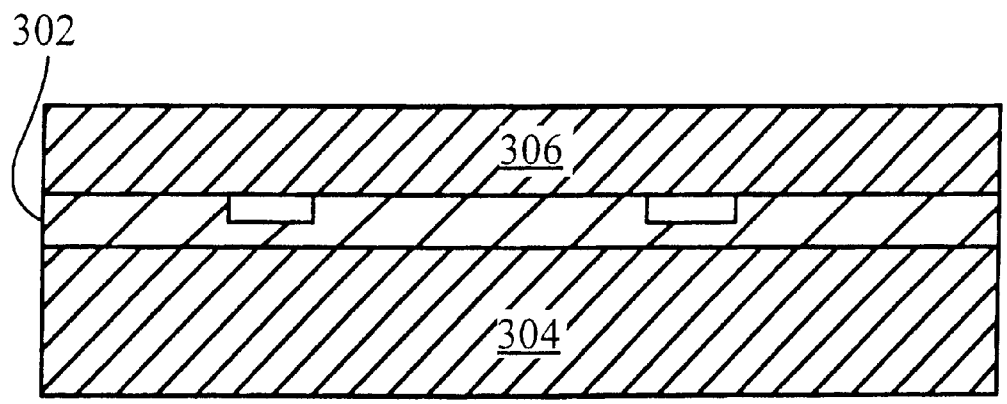

After depressions 310 have been formed, a device layer 306 is bonded to sacrificial layer 302 as shown in FIG. 3C. Device layer 306 may be any suitable material depending on the desired application. In a specific embodiment, device layer 306 is a layer of silicon.

Figure 3D:
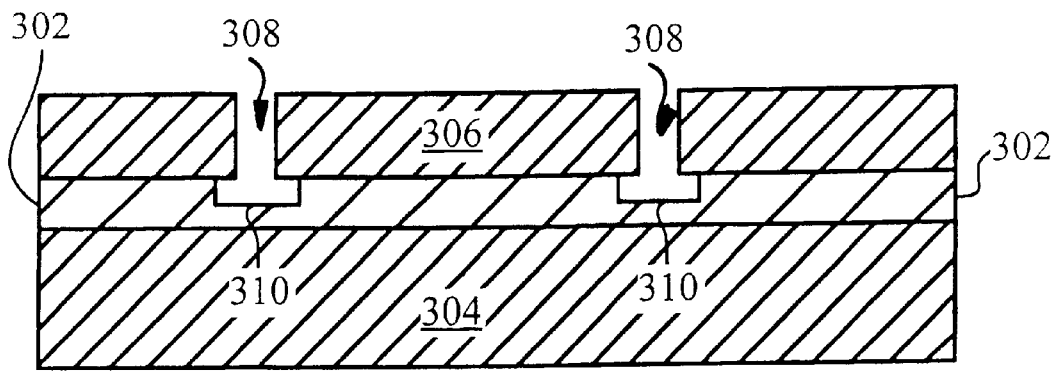

Next one or more vias 308 are formed through device layer 306 all the way through to depressions 310 in sacrificial layer 302 as shown in FIG. 3D. Vias 308 may be formed in device layer 306 by dry etch processes, such as reactive ion etching (RIE) or wet etch processes, e.g., anisotropic etching of Si with KOH as described above. Alternatively, vias 308 may be laser drilled or formed by local oxidation (LOCOS) and oxide etch. In the exemplary embodiment shown, depressions 310 have a diameter that is greater than a diameter of vias 308. Alternatively, the diameter of depressions 310 may be the same as or smaller than the diameter of vias 308.

Figure 3E:
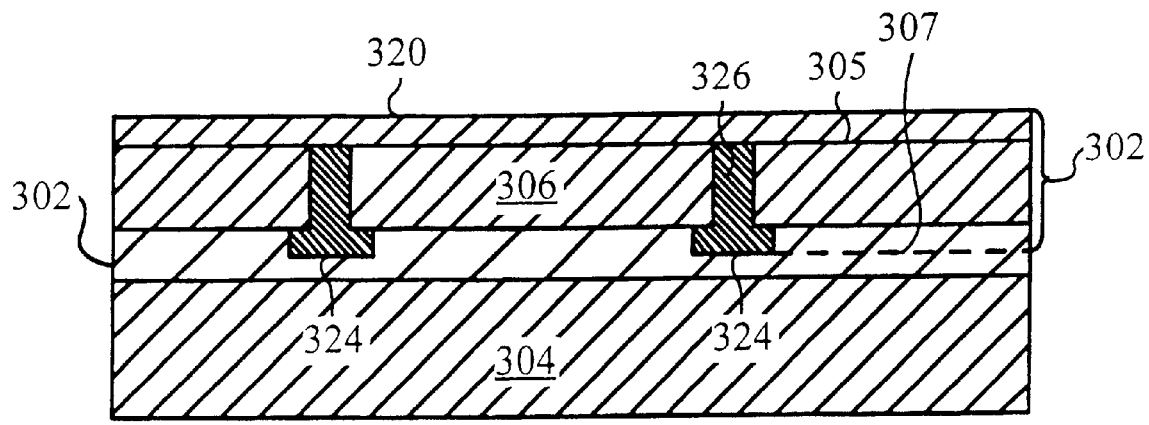

After vias 308 have been formed in device layer 306, vias 308 and depressions 310 are filled with a layer landing pad material 320 as shown in FIG. 3E. Layer 320 may optionally be planarized down to a top surface 305 of device layer 306, e.g. by chemical mechanical polishing (CMP). Filling depressions 310 and vias 308 forms a structure having one or more landing pads 324 protruding from an underside 307 of device layer 306. Each landing pad 324 is connected to the structure by a plug 326 of material that fills via 308. The depth d of depressions 310 determines the thickness of landing pads 324. Because depressions 310 have larger diameters that vias 308, landing pads 324 have a larger diameter than plugs 326 resulting in a landing pad structure similar to that shown in FIG. 1B.

Figure 3F:
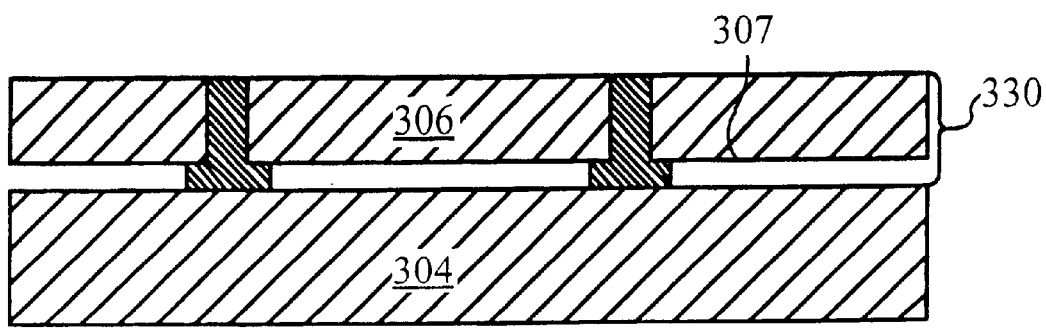

Pad material layer 320 and device layer 306 generally comprise a device 330. After landing pad material 320 has been deposited, sacrificial layer 302 is removed to release device 330 as shown in FIG. 3F. Sacrificial layer 302 may be removed by any suitable method, such as wet etch or other isotropic etch process.

Figure 4A:
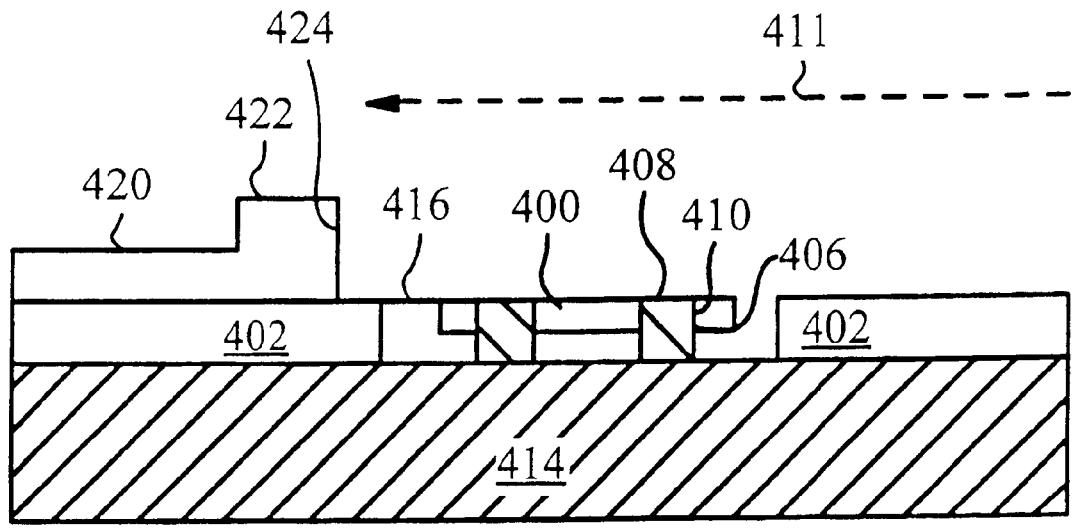
FIGS. 4A–4B depicts a microelectromechanical mirror element according to a sixth embodiment of the present invention.

A sixth embodiment of the present invention includes an electromechanically actuatable mirror element of a type used in optical fiber switching arrays. Micromechanical elements are described in U.S. Provisional Patent Application Serial No. 60/123,496 to Behrang Behin, Kam Lau and Richard Muller, titled "Global Mechanical Stop for Precise Mirror Positioning" which is incorporated herein by reference. An exemplary embodiment of such a mirror element 400 according, the present invention is depicted in FIG. 4A. Mirror element 400 generally is formed from a device layer 402 as described above with respect to FIGS. 2A–2E or 3A–3F. At least one landing pad 404 protrudes from an underside 406 of mirror element 400. Landing pad 404 is attached to mirror element 400 by a plug 408 passing through an opening 410 in mirror element 400. Landing pad 404 provides a smaller contact area 412 that serves to reduce stiction between mirror element 400 and an underlying substrate 414. Stiction may also be reduced by proper choice of the material comprising landing pad 404.

Figure 4B:
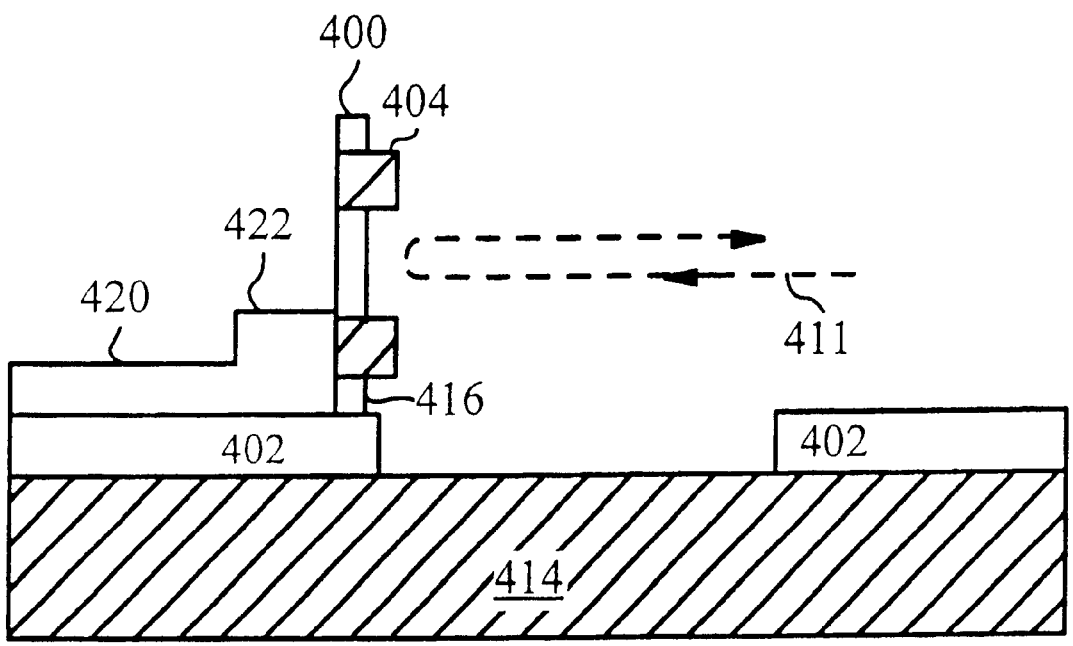

Mirror element 400 may be attached to mirror layer 402 via one or more compliant flexures 416. Such a mirror element can be actuated between an 'on' position, at which it intercepts an optical beam 411 as shown in FIG. 4B, and an 'off' position, at which it allows optical beam 411 to pass as shown in FIG. 4A. A second chip 420 containing vertical sidewall 422 may be positioned on top of the chip containing mirror 400, so that when flipped vertically by application of a magnetic field, mirror 400 can be pulled in to the sidewall by application of an electrostatic force. Electrostatic clamping to a precise vertical clamping surface 424 on a sidewall 426 defines the mirror position accurately and reproducibly when it is in the 'on' position. To ensure that all mirrors in an array have the same 'on' angle, the clamping surfaces for different mirrors may be constructed at the same angle on a single substrate. This provides a global mechanical positioning mechanism for a field of actuated mirrors.

Mirror element 400 and the clamping surfaces are typically constructed from electrically conductive material. Landing pads 404 made of an insulating material may prevent electrical contact between the mirrors and the clamping surfaces when the two conductive surfaces are brought together.

Flexures 416 allow mirror element 400 to move out of a plane defined by mirror layer 402 as shown in FIG. 4B. Mirror actuation may be performed by applying an external magnetic field that interacts with a magnetic material on the mirror element 400. Lateral compliance of the torsional flexures 416 reduces the electric field necessary to pull the mirror to sidewall 422, and allows mirror element 400 to make contact with sidewall 422 at three or more points when sufficient electrostatic field is applied. After mirror element 400 is electrostatically clamped to sidewall 422, the magnetic field can be switched on and off without affecting the mirror position. Once the electrostatic field is turned off, torsional flexures 416 pull mirror element 400 back to its horizontal position by torsional flexures 416. A horizontal magnetic field may also be employed to aid in actuating mirror element 400 back to the horizontal position.

Mirror 400, in the horizontal position, can be clamped electrostatically to substrate 414 to prevent it from responding to an external field. Selective electrostatic clamping of mirrors in both the vertical and horizontal positions allows individual addressing of mirrors belonging to an array and subject to the same external magnetic field.

Mirror 400 and the top chip 420 may be fabricated by silicon microfabrication techniques such as polycrystalline-silicon surface-micromachining process. The top chip 420 containing the sidewalls 422 may be fabricated by anisotropic etching of (110)-oriented Si. Such a method ensures angular uniformity of the sidewalls over the area of the top chip. Furthermore, mirror 400 may be fabricated from a silicon on insulator (SOI) substrate by either of the two methods described above.

Figure 5A:
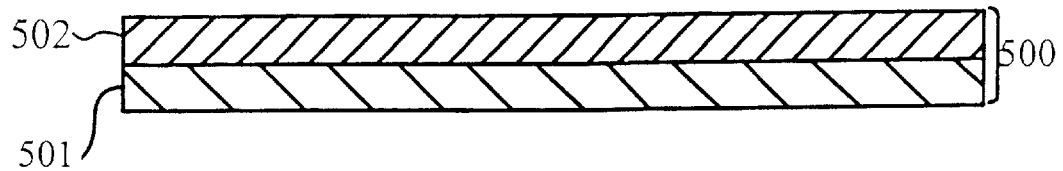
FIGS. 5A–5F depict fabrication of a device according to a seventh embodiment of the present invention.

Devices of the type shown in FIGS. 1A–1C and 4 may alternatively be fabricated by a method according to a seventh embodiment of the invention. The basic steps of the method are depicted in FIGS. 5A–5F. FIG. 5A depicts a substrate 500 from which the device is made. Substrate 500 generally comprises a device layer 501 and a landing pad material layer 502. Device layer 501 may be any suitable material depending on the desired application. In a specific embodiment, device layer 501 is a layer of silicon. Landing-pad material layer 502 may be deposited or formed on a surface of device layer 501 by any conventional means.

Figure 5B:
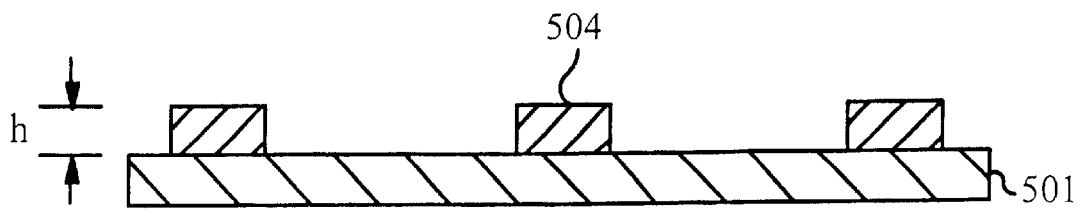

Next landing-pad material layer 502 is partially etched to form one or more landing pads 504 having a height h as shown in FIG. 5B. Landing pads 504 may be formed by any suitable technique such as reactive ion etching (RIE) or wet etch processes, e.g., anisotropic etching of silicon with KOH as described above. Alternatively, landing pads 504 may be ion milled or formed by local oxidation (LOCOS) and oxide etch.

Figure 5C:
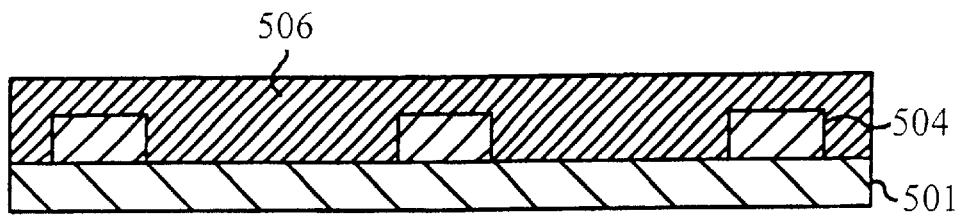

Next, a sacrificial layer 506 is deposited over landing pads and substrate 500 as shown in FIG. 5C. Typically, sacrificial layer 506 includes an oxide. Alternative sacrificial layers include nitrides, glasses and polymers. Sacrificial layer 506 is typically planarized, e.g. by CMP to a thickness t. Preferably, height h of landing pads 504 is less than thickness t of sacrificial layer 506 so that landing pads 504 are not exposed. If the landing pads 504 may have different heights t is preferably greater than the height of the tallest landing pad.

Figure 5D:
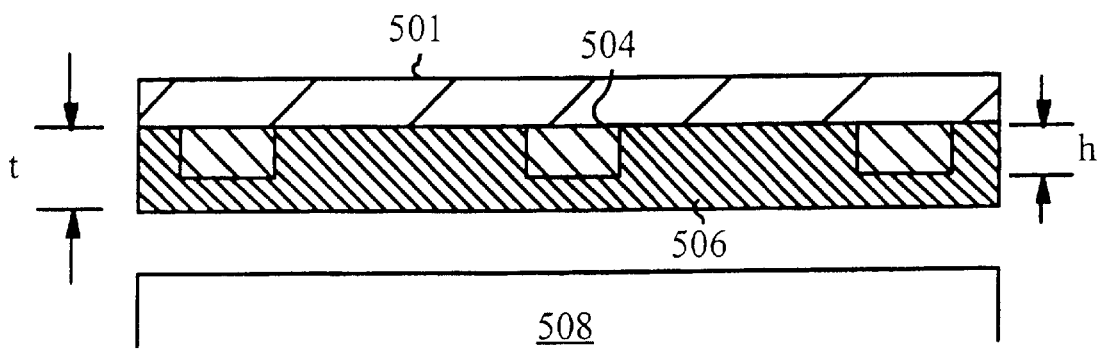
Figure 5E:
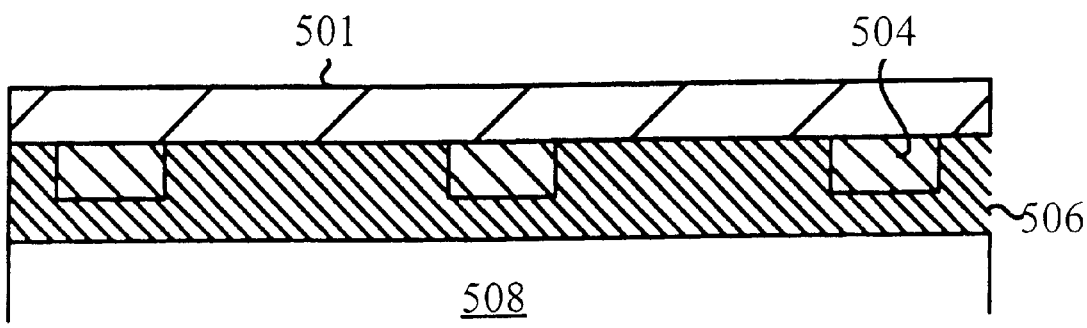

After sacrificial layer 506 has been planarized, substrate 500 may be inverted so that sacrificial layer 506 faces a base layer 508 as shown in FIG. 5D. As a result of this step, landing-pads 504 protrude from an underside 509 of substrate 500. Next, substrate 500 is bonded to base layer 508 via sacrificial layer 506 as shown in FIG. 5E.

Figure 5F:
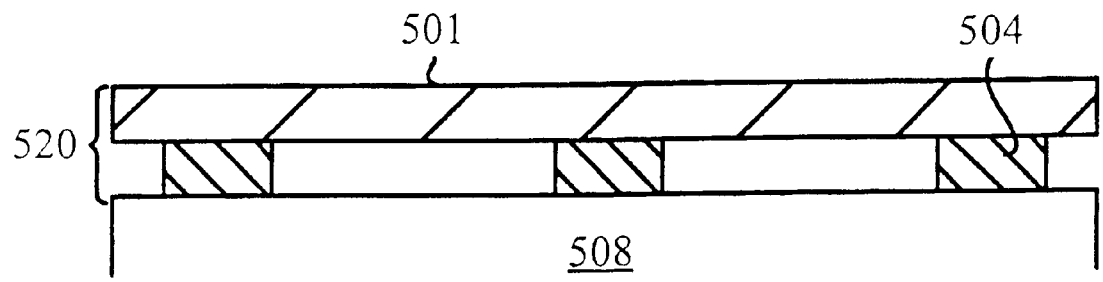

Device layer 501 and landing pads 504 generally comprise a device 520, which may be released by removing sacrificial layer 506 as shown in FIG. 5F. Sacrificial layer 506 may be removed by any suitable method, such as wet etch or other isotropic etch process.

Other variations on the above described devices and fabrication methods are possible. For example, in a eighth embodiment, any of the above-described fabrication methods may be used to fabricate a device having landing pads with "air-spaced" standoffs. The device 600, depicted in FIGS. 6A–6B, includes a device layer 602 and at least one landing pad 604 protruding from an underside 606 of device layer 602.

Figure 6A:
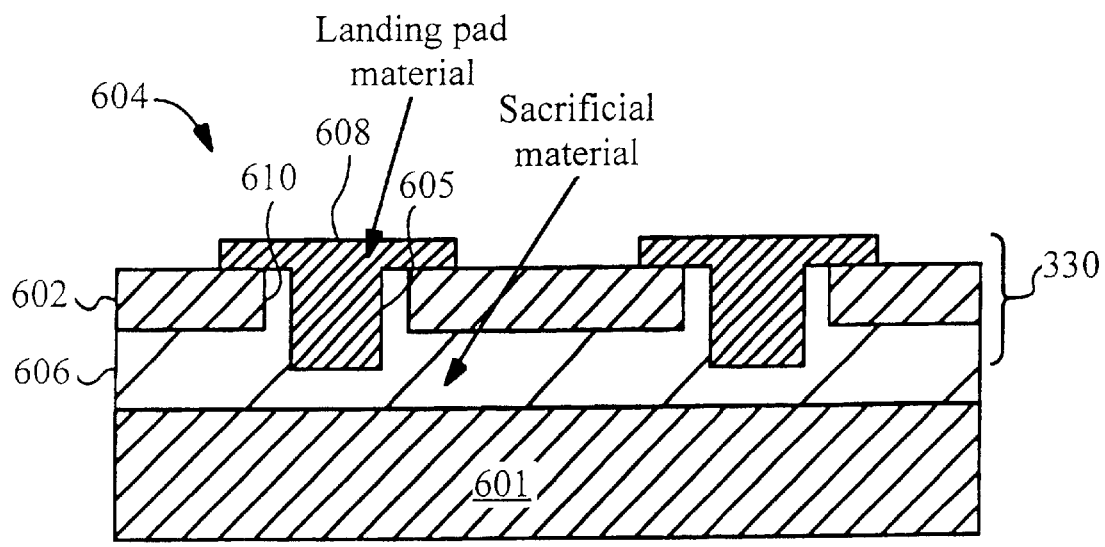
FIGS. 6A–6B depict fabrication of a device according to an eighth embodiment of the present invention.
Figure 6B:
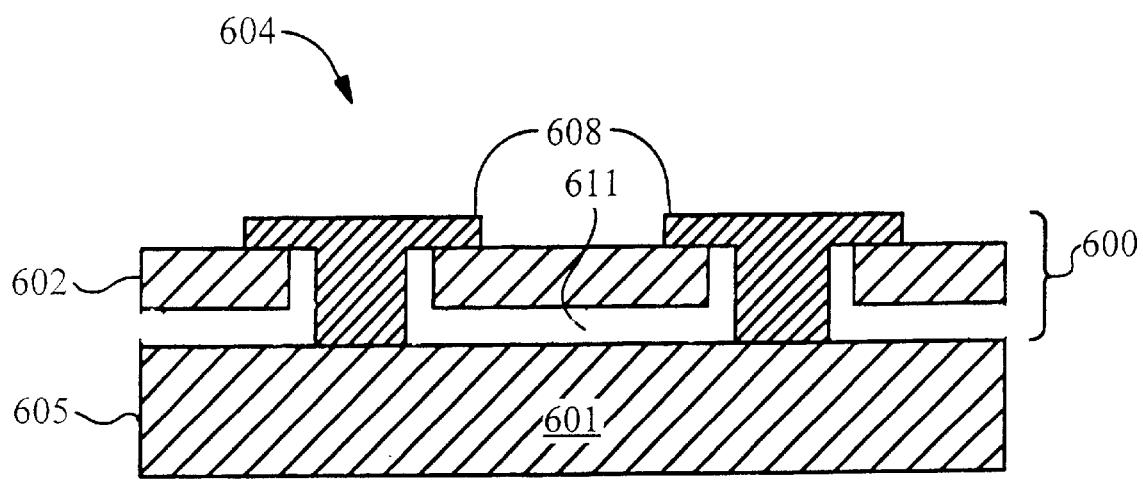

Landing pad 604 has a plug 605 that protrudes through an opening 610 in device layer 602. Landing pad 604 is attached to device layer 602 by a flange 608. The landing pad 604 provides a smaller contact area 612 than an area of underside 606. Plug 605 generally has a diameter that is smaller than a diameter of opening 610. This configuration produces a gap 611 between plug 605 and device layer 602. The resulting structure provides an air-spaced standoff. Flanges 610 on neighboring landing pads 604 may be isolated from each other as shown in FIGS. 6A–6B. Alternatively, neighboring landing pads 604 may protrude from a common layer of landing pad material.

Device 600 may be manufactured on a substrate 601 according to any of the methods described above. For example, FIG. 6A depicts the device 600 prior to removal of a sacrificial layer 620. FIG. 6B depicts the device 600 after removal of a sacrificial layer 620.

Figure 7A:
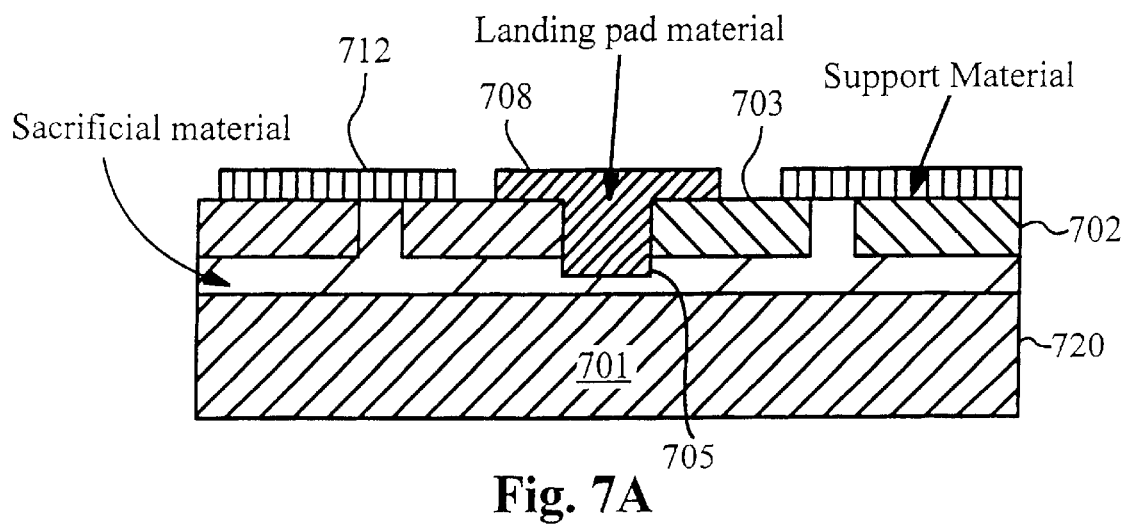
FIGS. 7A–7B depict fabrication of a device according to a ninth embodiment of the present invention.
Figure 7B:
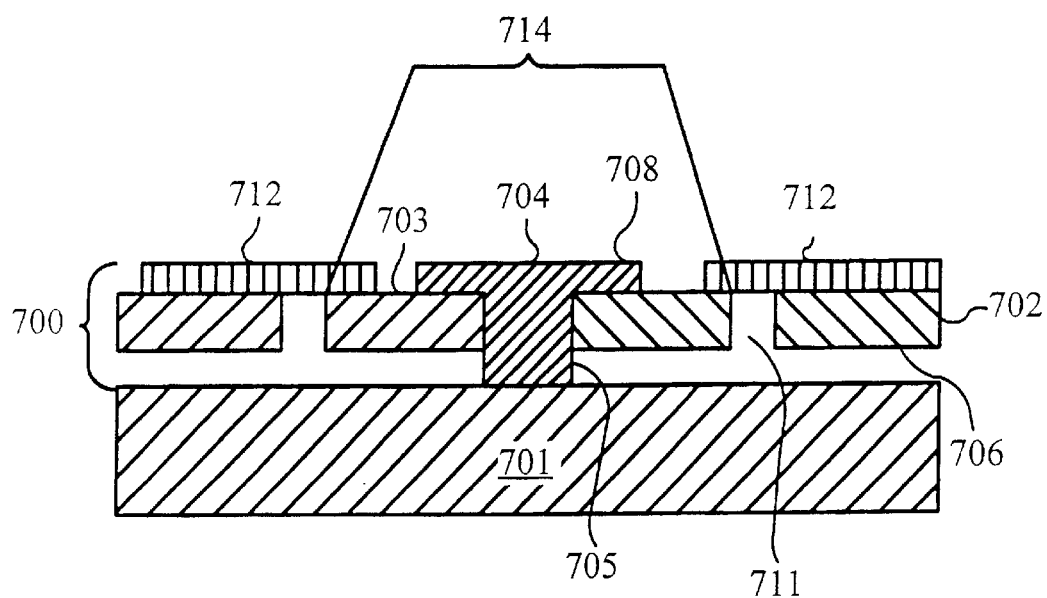
Figure 8:
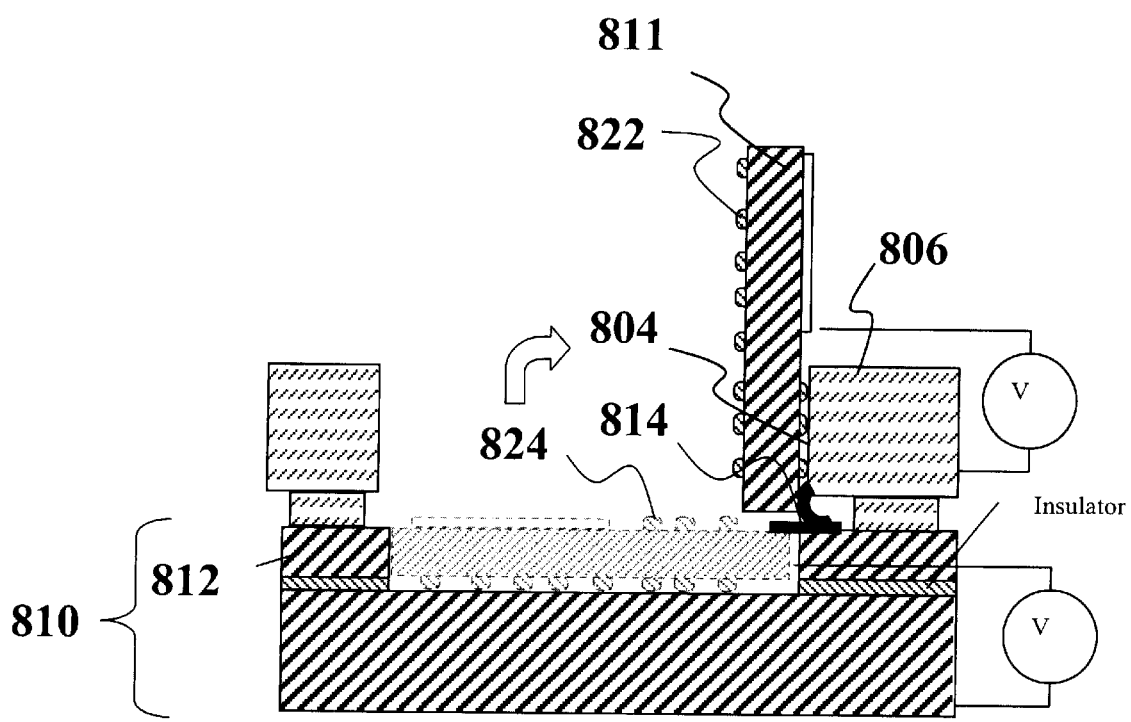
FIG. 8 depicts a cross-sectional schematic diagram of a MEMS device according to the prior art.

In an ninth embodiment of the invention, a device 700 may be manufactured with one or more standoffs separated from the rest of the device layer as depicted in FIGS. 7A–7B. The device 700 is typically manufactured on a substrate 701 having a sacrificial layer 720 as shown in FIG. 7A. The device 700 includes a device layer 702 and at least one landing pad 704 protruding from an underside 706 of device layer 702. Landing pad 704 has a plug 705 that protrudes through an opening 710 in a standoff region 703 of device layer 702. Landing pad 704 is attached to standoff region 703 by a flange 708. One or more trenches 710 formed in device layer 702 separate standoff region 703 from the rest of device layer 702. During fabrication, sacrificial layer 720 mechanically supports device layer 702, standoff region 703 and landing pad 704. A layer of support material 712, formed over trenches 710 provides a connection between standoff region 703 and the rest of device layer 702. Standoff region 703 and landing pad 704 form a separated standoff 714 when sacrificial layer 720 is removed, as shown in FIG. 7B. Support material 712 provides a mechanical structural support for standoff 714 and device layer 702 after sacrificial layer 720 is removed. Such a configuration is useful, for example, in applications where it is desirable to electrically isolate standoff 714 from device layer 702.

Figure 9A:
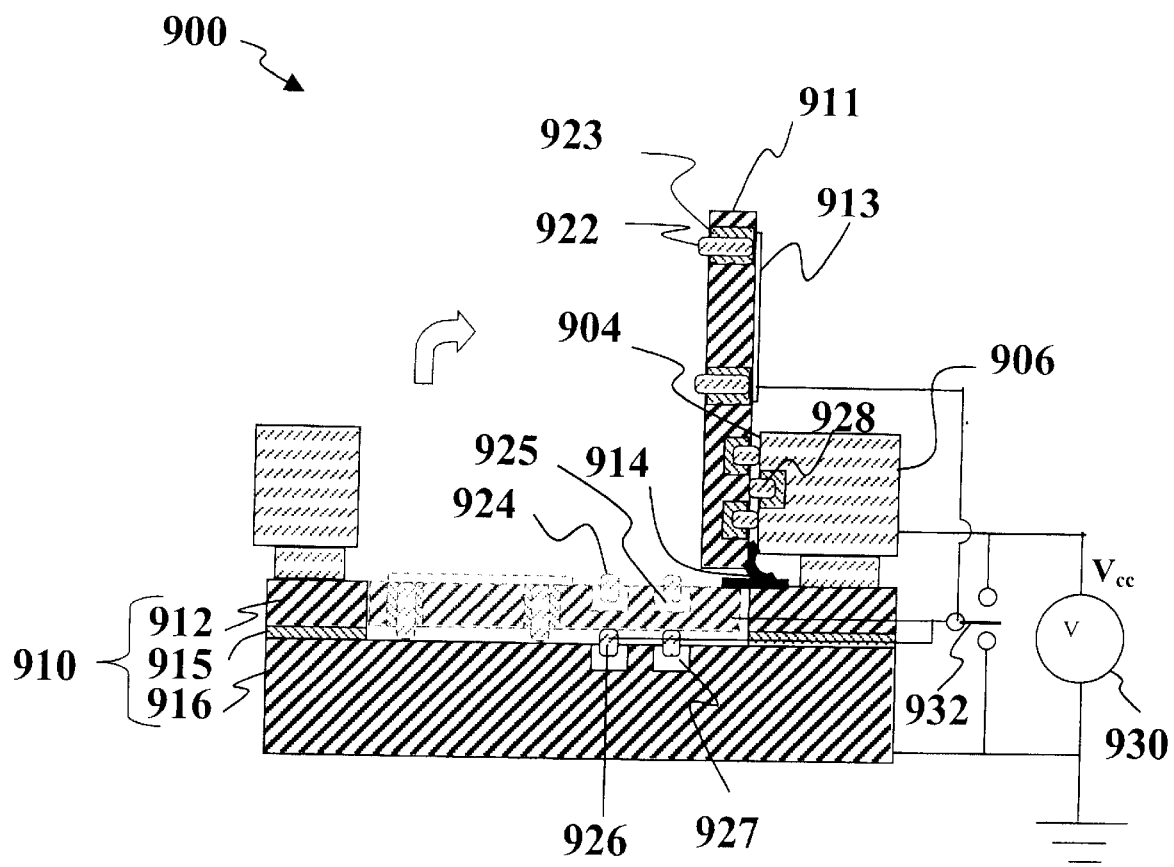
FIG. 9 depicts a cross-sectional schematic diagram of a MEMS device according to a tenth embodiment of the present invention.
Figure 9B:
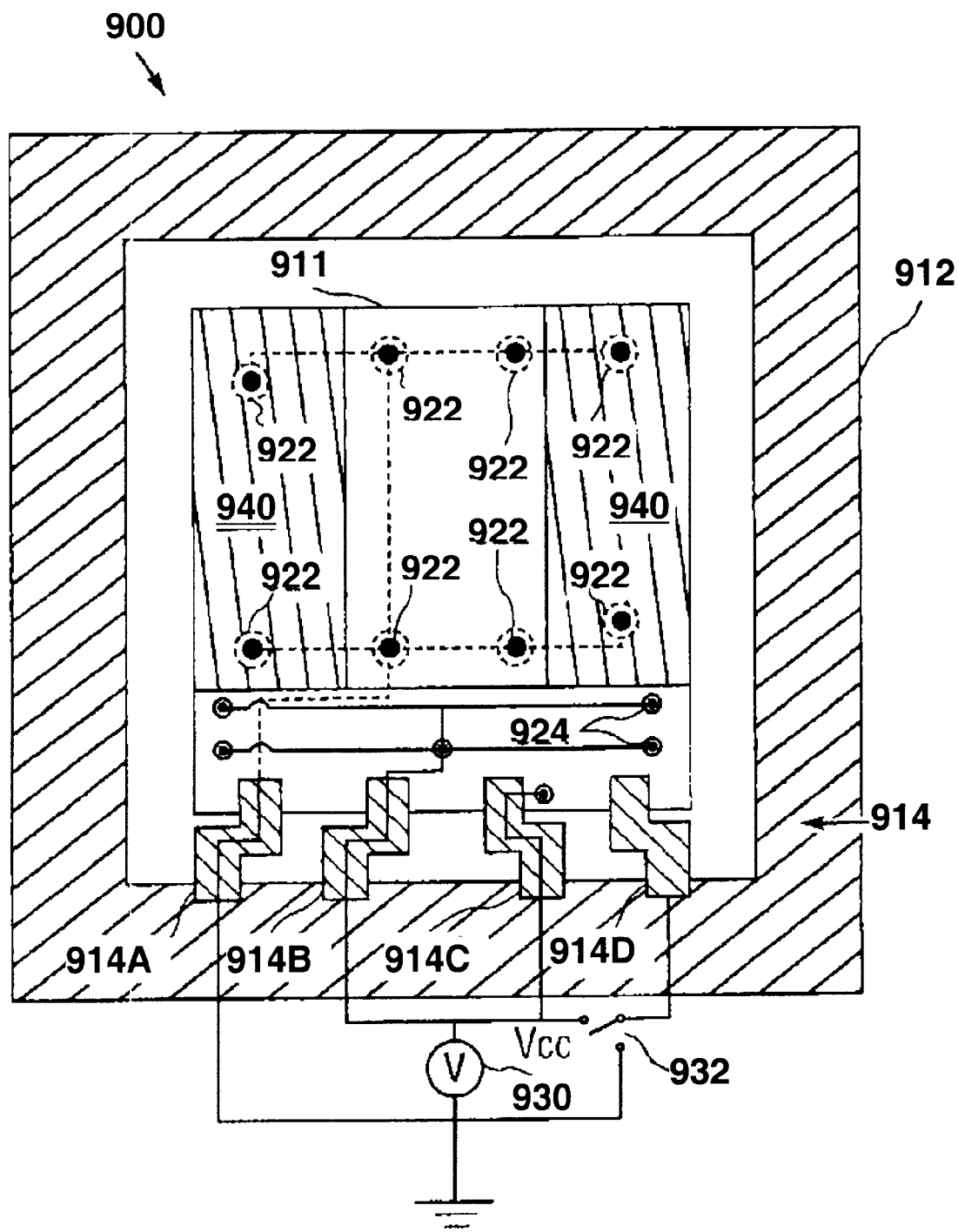

FIGS. 9A and 9B respectively depict cross-sectional and top plan schematic diagrams of a MEMS device 900 according to a ninth embodiment of the present invention. The device 900 includes a flap 911 formed from the device layer 912 of a SOI substrate 910 containing the device layer 912 an insulating layer 915 and a base 916. The flap 911 is movably attached to the device layer 912 by one or more flexure 914. Flexure 914 may be electrically conductive and coupled to one or more topside dimples 924, one or more bottomside dimples 922 or the flap 911. Multiple flexures can provide unique electrical paths to achieve equipotential design, while MEMs springs can also be used to couple connections to a movable flap. FIG. 9B shows a configuration of three flexures 914A, 914B and 914C that provide equipotential to the dimples and clamping voltage to the flap while also providing torsion restoring force thereto. The fourth flexure 914D which is coupled between the flap 911 and the device layer 912 is shown to have a purely mechanical function.

While FIGS. 9A and 9B illustrate a flap design having top- and bottom-side equipotential dimples, it is understood to be part of the present invention that a flap may be configured with one or more equipotential dimples that, in addition to contacting a vertical sidewall in the ON state, may also contact the substrate in the OFF state. This design combines topside and bottomside dimples into a single landing pad structure. In this configuration, the dimple may be flat, electrically isolated from, and substantially parallel to the mirror. A single clamping voltage may be used to secure the flap in the ON and OFF states. A flap may be electrostatically held to one or more vertical sidewall structures.

The flap may include a reflecting surface 913 so that the device 900 acts as a MEMS mirror. The flap 911 may be actuated by an off-chip electromagnet and can be individually addressed by electrostatic clamping either to a surface of a base 916 of the substrate 910 or to a vertical sidewall 904 of a top mounted chip 906. The flap may include a metallic or magnetic material 940, e.g., Nickel. An external magnetic field produced by the electromagnet exerts forces on the magnetic material that move the flap 911 between an "off" position parallel to the substrate 910 and an "on" position nearly parallel to the vertical sidewall 904 of the topmounted chip 906.

The sidewall 904 and a surface of the base 916 serve as landing surfaces for the flap 911. A voltage source 930 may be coupled between the top-mounted chip 906 and the base 916. In the embodiment shown in FIGS. 9A–9B, the voltage source 930 applies a voltage $V_{cc}$, e.g., about 40 V, between the top chip 906 and the base 916. By way of example, the voltage source 930 may apply a positive $V_{cc}$ to the top chip 906 while the base 916 is grounded.

Flap 911 may be selectively coupled through switch 932 to $V_{cc}$ or ground to provide electrostatic clamping. For example, if the top chip is at $V_{cc}$, and the flap 911 is in the "on" position, the switch 932 couples the flap 911 to ground, e.g., to the base 916. A voltage difference between the flap 911 and the top chip 906 produces an electric field that clamps the flap 911 against the sidewall 904. When the flap is in the "off" position and the base 916 is grounded, the switch 932 couples the flap 911 to $V_{cc}$. A voltage difference between the base 916 and the flap 911 produces an electric field that clamps the flap 911 against a surface of the base 916. The electrostatic fields hold the flap 911 in position regardless of whether the magnetic field is on or off.

When clamped to the landing surfaces, e.g., the surface of the base 916 or the vertical side-wall surface 904, the flap 911 rests on a set of electrically conductive landing pads or dimples 922 that protrude above the surface of an underside of the flap 911 and are insulated from the flap 911 by an insulating material 923. The landing pads 922 (Shown in phantom in FIG. 9B) may be electrically coupled to the base 916 through a first flexure 914A or an electrically conductive MEMs spring, to reduce stiction effects. The first flexure 914A may be electrically insulated from the flap 911, the device layer 912 and the top chip 906. Thus, when the flap 911 and the base 916 are at different potentials, the landing pads 922 are equipotential to, i.e., at the same potential as, the base 916. This prevents trapping of electrical charge and arcing due to different potentials. The insulating materials 923 prevent an electrical short between the flap 911 and the base.

The flap 911 may optionally include a set of electrically conductive top landing pads 924 that protrude from a top surface of the flap 911. The top landing pads 924 may be electrically connected to each other and may be electrically insulated from the flap 911 by an insulating material 925. To reduce stiction effects, the top landing pads 924 may be electrically coupled so that it is substantially equipotential to the top chip 906 through a second flexure 914B or an electrically conductive MEMs spring. The second flexure 914B may be electrically insulated from the flap 911, the device layer 912 and the base 916.

Third flexure 914C or MEMs spring may connect to mirror 913 and through programmable switch 932 to Vcc such that the voltage potential can be programmably coupled through the flap 911. When switch 932 is OFF, Vcc charges mirror 911 with a potential, flap 911 is electrostatically attracted and clamped on the base 916, and the bottomside landing pads 922 make contact with the base 916 at the ground equipotential. When switch 932 is ON, Vcc grounds the flap 911, the flap 911 is electrostatically attracted to the top chip 906 and the topside landing pads 924 make contact with top chip 906 at Vcc equopotential.

It must be stated an alternative design whereby polarity may be reversed so that a negative voltage $V_{cc}$ may be applied to the top chip 906 or the top chip may be grounded and the voltage $V_{cc}$ may be applied to the base 916.

Furthermore, it must be stated that the device 900 may optionally include one or more electrically conductive base landing pads 926 disposed on a surface of the base 916 and insulated from the base 916 by an insulating material 927. The device 900 may also optionally include one or more electrically conductive sidewall landing pads 928 that are electrically isolated from the sidewall. The base landing pads 926 and sidewall landing pads 928 may be electrically coupleable such that they may be selectively made substantially equipotential to the flap 911, e.g., by a third flexure 914C and the switch 932.

Any of the landing pads 922, 924, 926, 928 may be in the form of a plug that protrudes through an opening in the insulating material 923, 925, 927. Alternatively, the landing pads 922, 924, 926 may be in the form of plugs with flanges attached to the flap by a layer of electrically insulating support material similar to that shown in FIGS. 7A–7B. Alternatively, the device 900 may optionally include conductive sidewall landing pads 928 disposed on the sidewall 904 that are electrically isolated from the sidewall 904 and electrically coupled to the flap 911, e.g. via an insulated connector on the flexure 914C.

The conductive landing pads 922, 924, 926, 928 may be made from those materials that exhibit conductive properties, as one skilled in the art would be capable of applying. Such materials include, but are not limited to polysilicon, amorphous silicon, single crystal silicon, conductive diamond films, silicon germanium, and metals. The insulating materials 923, 925, 927 may be any of those materials that exhibit insulative properties, as one skilled in the art would be capable of applying. Such materials include, but are not limited to silicon nitride, silicon oxide, undoped single crystal silicon, undoped polysilicon and undoped silicon germanium.

It must be stated that the landing pads may be configured flush to flap 911 so that they create landing areas and do not protrude through flap 911.

Figure 10A:
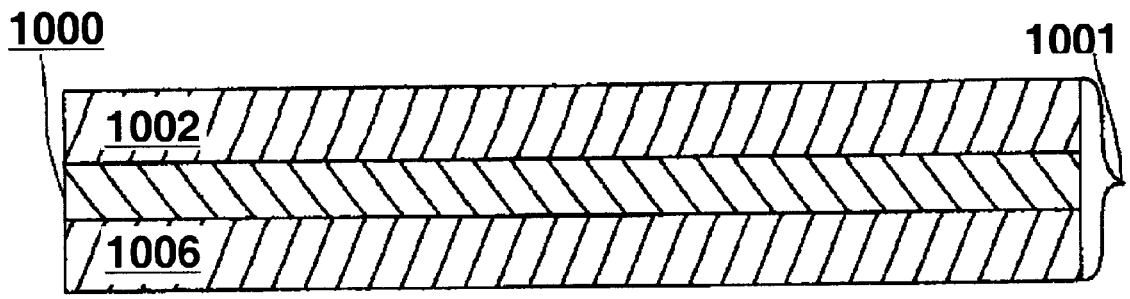
FIGS. 10A–10F depict simplified cross sectional schematic diagrams depicting the fabrication of a MEMS device according to an eleventh embodiment of the invention.
Figure 10B:
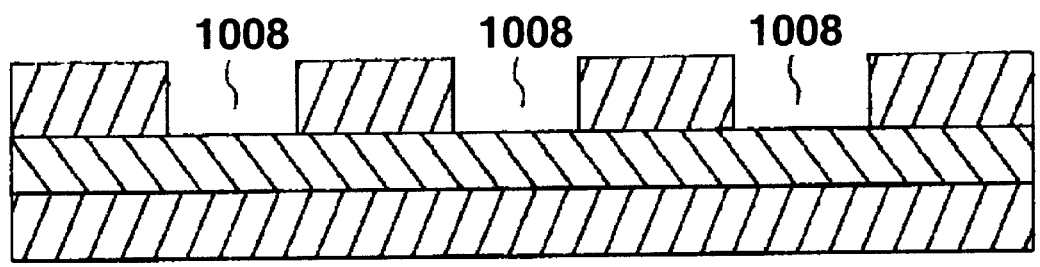
Figure 10C:
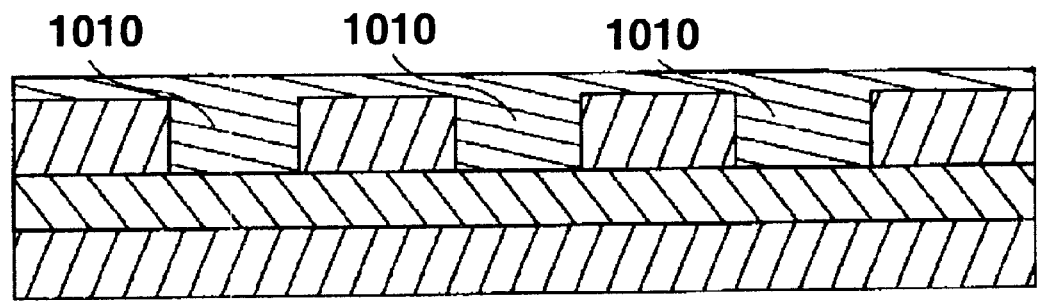
Figure 10D:
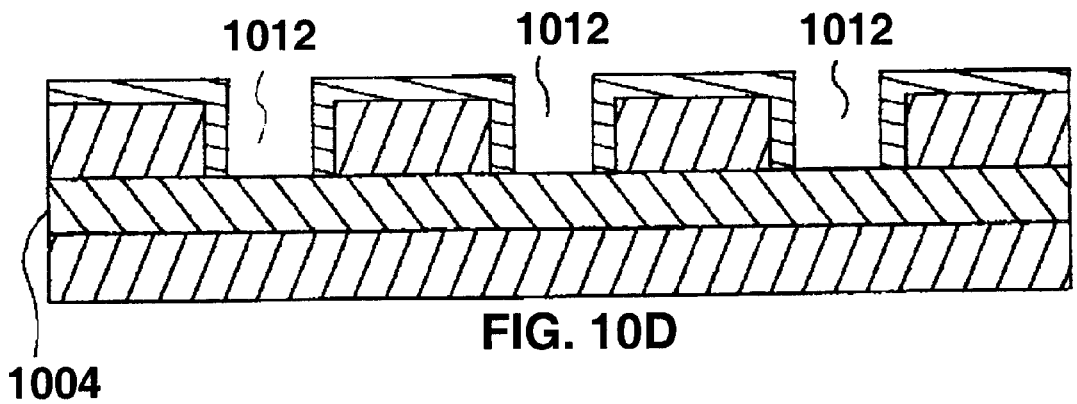
Figure 10E:
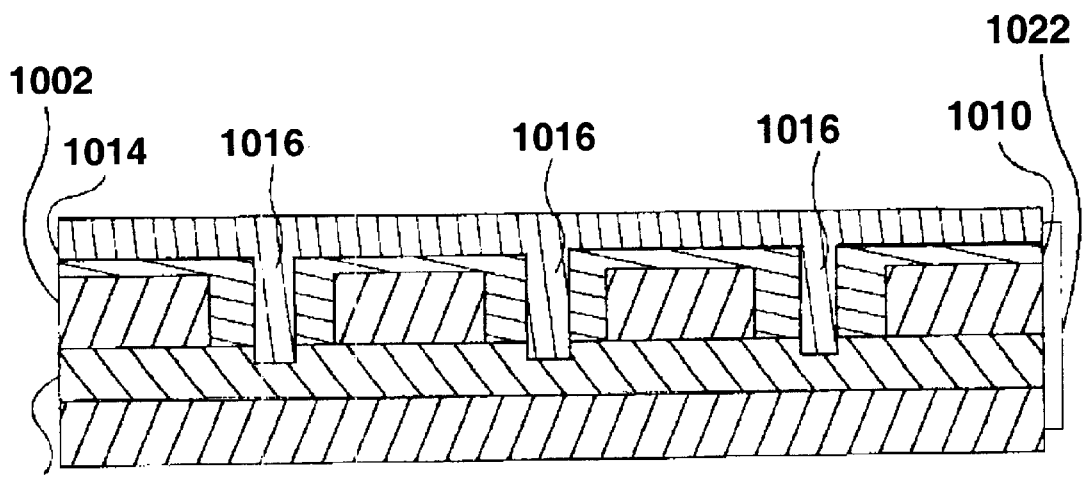
Figure 10F:
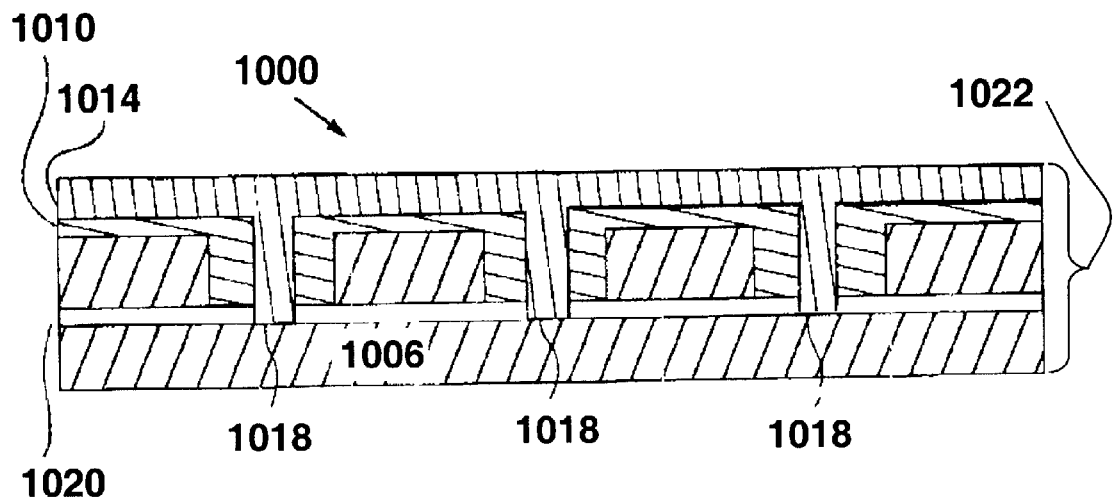

FIGS. 10A–10F depict simplified cross sectional schematic diagrams depicting the fabrication of a MEMS device of the type shown in FIG. 9. The method starts at FIG. 10A with a SOI substrate 1001 having a device layer 1002, a sacrificial insulating layer 1004 and a base layer 1006. Next, as shown in FIG. 10B, several openings 1008 are made in the device layer 1002. The openings 1008 are filled with an insulating material 1010 as shown in FIG. 10C. The insulating material 1010 may also cover the surface of the device layer 1002. Next vias 1012 are formed through the insulating material 1010 that fills the openings 1008 as shown in FIG. 10D. The vias may be formed by a dry etch process or an anisotropic wet etch process. The vias 1012 penetrate partly into the sacrificial insulating layer 1004. Next the vias 1012 are filled with a conducting material 1014 to form conductive plugs 1016. The conducting material 1014 may also cover the surface of the insulating material 1010 that overlies the device layer 1002 to provide a common electrical connection between the conductive plugs 1016. The sacrificial insulating layer 1004 is removed, e.g. by isotropic etch, as shown in FIG. 10F. The ends of the conductive plugs 1016 project slightly beyond a lower surface of the device layer 1002 and insulating material 1010 to form landing pads 1018 that are electrically isolated from the device layer 1002. The landing pads 1018 may then be electrically coupled to a landing surface of the base layer 1006 by an electrical connection 1022 coupled to the conducting material 1014. The electrical connection 1022 may be formed contemporaneously with the layer of conducting material 1014 and electrically insulated from the device layer 1002, e.g., by the insulating material 1010.

It will be clear to one skilled in the art that the above embodiments may be altered in many ways without departing from the scope of the invention. For example, a device of the type depicted in FIG. 9 may be fabricated by suitable variation on the methods shown and described with respect to FIGS. 3A–3F, 5A–5F, 6A–6A, or 7A–7B. Accordingly, the scope of the invention should be determined by the following claims and their legal equivalents.

What is claimed is:

1. A MEMS device comprising
  a) a base;
  b) a flap having a bottom portion movably coupled to the base such that the flap is movable with respect to a plane of the base from a first orientation to a second orientation; and
  c) one or more electrically conductive landing pads connected to the flap, wherein the one or more landing pads are electrically isolated from the flap and electrically coupled to be equipotential with a landing surface.

2. The device of claim 1, wherein the landing surface is a surface of the base and the one or more landing pads are electrically equipotential to the base.

3. The device of claim 1, further comprising one or more electrically conductive base landing pads protruding from a surface of the base.

4. The device of claim 1, further comprising one or more electrically conductive top landing pads protruding from a top surface of the flap, wherein the top landing pads are electrically isolated from the flap.

5. The device of claim 1 further comprising one or more flexures attached to the flap.

6. The device of claim 1 further comprising a sidewall for limiting the motion of the flap, the sidewall having one or more sidewall landing pads that are electrically isolated from the sidewall and electrically coupled such that they are substantially equipotential to the flap.

7. The device of claim 1 wherein the device is a microelectromechanical mirror.

8. The device of claim 1 wherein the device is formed from a silicon on insulator substrate.

9. The device of claim 1 wherein one or more of the landing pads protrude from the flap.

10. The device of claim 1 wherein the one or more of the landing pads are configured flush to the flap.

11. The device of claim 1 wherein the device is an optical fiber switching array.

12. The device of claim 2, further comprising a voltage source controllably coupled to the flap.

13. The device of claim 2, further comprising at least one flexure coupled to the flap.

14. The device of claim 13, wherein at least one flexure provides an electrical to the landing pads.

15. The device of claim 3 wherein the base landing pads are insulated from the base and electrically coupled to be equipotential with the flap.

16. The device of claim 4, further comprising a sidewall for limiting the motion of the flap, wherein the one or more top landing pads are electrically connected such that the sustain equipotential with the sidewall.

17. The device of claim 16, further comprising a flexure coupled to the flap.

18. The device of claim 16 wherein the flexure is a MEMs spring.

19. The device of claim 17, wherein the flexure provides an electrical connection between the one or more top landing pads and the sidewall.

20. The device of claim 5, wherein the flexure provides an electrical connection between a switch and the flap.

21. The device of claim 6, further comprising a voltage source selectively coupled between the sidewall and the flap.

22. A MEMS device comprising
  a) base;
  b) a flap having a bottom portion movably coupled to the base such that the flap is movable with respect to a plane of the base from a first orientation to a second orientation; and c) one or more electrically conductive landing pads connected to a surface of an underside of the flap, wherein the one or more landing pads are electrically isolated from the flap and electrically coupled to be equipotential with a landing surface.

23. The device of claim 22, further comprising a sidewall for limiting the motion of the flap, wherein one or more top landing pads are electrically connected such that they are substantially equipotential with the sidewall.

24. The device of claim 22, further comprising one or more electrically conductive top landing pads on a top surface of the flap, wherein the top landing pads are electrically isolated from the flap.

25. The device of claim 23, wherein the sidewall includes one or more sidewall landing pads wherein the one or more sidewall landing pads are electrically isolated from the sidewall, and wherein the one or more sidewall landing pads are connected to the flap such that they are substantially equipotential to the flap.

* * * * *